(12) United States Patent
Hsu et al.

(10) Patent No.: US 12,324,286 B2
(45) Date of Patent: Jun. 3, 2025

(54) LIGHT-EMITTING DEVICE

(71) Applicant: QUANZHOU SANAN SEMICONDUCTOR TECHNOLOGY CO., LTD., Fujian (CN)

(72) Inventors: Chen-ke Hsu, Fujian (CN); Changchin Yu, Fujian (CN); Zhaowu Huang, Fujian (CN); Junpeng Shi, Fujian (CN); Weng-Tack Wong, Fujian (CN)

(73) Assignee: QUANZHOU SANAN SEMICONDUCTOR TECHNOLOGY CO., LTD, Fujian (CN)

( * ) Notice: Subject to any disclaimer, the term of this patent is extended or adjusted under 35 U.S.C. 154(b) by 0 days.

(21) Appl. No.: 18/623,973

(22) Filed: Apr. 1, 2024

(65) Prior Publication Data

US 2024/0266484 A1    Aug. 8, 2024

Related U.S. Application Data

(63) Continuation of application No. 17/360,956, filed on Jun. 28, 2021, now Pat. No. 11,978,839, which is a
(Continued)

(30) Foreign Application Priority Data

| | | |
|---|---|---|
| Feb. 3, 2019 | (CN) | 201910108696.2 |
| Feb. 3, 2019 | (CN) | 201910108698.1 |
| Feb. 3, 2019 | (CN) | 201910108701.X |

(51) Int. Cl.
*H10H 20/856* (2025.01)
*H10H 20/851* (2025.01)
(Continued)

(52) U.S. Cl.
CPC ...... *H10H 20/856* (2025.01); *H10H 20/8515* (2025.01); *H10H 20/853* (2025.01); *H10H 20/857* (2025.01)

(58) Field of Classification Search
CPC ...... H10H 20/80; H10H 20/85; H10H 20/856; H10H 10/857; H10H 29/0036; H10H 29/24
See application file for complete search history.

(56) References Cited

U.S. PATENT DOCUMENTS

| | | | | |
|---|---|---|---|---|
| 11,978,839 | B2 * | 5/2024 | Hsu | H10H 20/8515 |
| 2009/0230422 | A1 * | 9/2009 | Katsuno | H10H 20/825 |
| | | | | 438/34 |

(Continued)

FOREIGN PATENT DOCUMENTS

| | | |
|---|---|---|
| CN | 101127377 A | 2/2008 |
| CN | 101154697 A | 4/2008 |

(Continued)

OTHER PUBLICATIONS

Search Report issued to PCT application No. PCT/CN2019/092364 on Nov. 6, 2019.

(Continued)

*Primary Examiner* — J. E. Schoenholtz
(74) *Attorney, Agent, or Firm* — MUNCY, GEISSLER, OLDS & LOWE, P.C.

(57) ABSTRACT

A light-emitting device includes a lead frame, a light-emitting diode (LED) chip, and an encapsulant. The LED chip is disposed on the lead frame, and includes a substrate, a semiconductor light-emitting unit disposed on a surface of the substrate, and a first electrode and a second electrode, which are disposed on the surface of the substrate, and which are located outwardly of the semiconductor light-emitting unit. The first and second electrodes are electrically connected to a lower surface of the semiconductor light- (Continued)

emitting unit, and are respectively connected to a first wiring bonding region and a second wiring bonding region on the lead frame. The encapsulant encapsulates the LED chip.

20 Claims, 14 Drawing Sheets

Related U.S. Application Data continuation-in-part of application No. PCT/CN2019/092364, filed on Jun. 21, 2019, and a continuation-in-part of application No. PCT/CN2019/092366, filed on Jun. 21, 2019, and a continuation-in-part of application No. PCT/CN2019/092368, filed on Jun. 21, 2019, and a continuation-in-part of application No. PCT/CN2019/074690, filed on Feb. 3, 2019.

(51) Int. Cl.
  *H10H 20/853* (2025.01)
  *H10H 20/857* (2025.01)

(56) References Cited

U.S. PATENT DOCUMENTS

| | | | | |
|---|---|---|---|---|
| 2015/0102375 | A1* | 4/2015 | Kim | H10H 20/84 257/98 |
| 2018/0040779 | A1* | 2/2018 | Baek | H10H 20/8512 |
| 2019/0355884 | A1* | 11/2019 | Pan | H10H 20/8506 |
| 2020/0135991 | A1* | 4/2020 | Lin | G06F 11/3698 |
| 2020/0258874 | A1* | 8/2020 | Male | H01L 25/167 |
| 2024/0250229 | A1* | 7/2024 | Zhu | H10D 30/0295 |
| 2024/0304776 | A1* | 9/2024 | Huang | H01L 25/167 |

FOREIGN PATENT DOCUMENTS

| | | |
|---|---|---|
| CN | 102447031 A | 5/2012 |
| CN | 103022311 A | 4/2013 |
| CN | 107768500 A | 3/2018 |
| CN | 108028286 A | 5/2018 |
| CN | 108091737 A | 5/2018 |
| CN | 109830500 A | 5/2019 |
| CN | 109830590 A | 5/2019 |
| CN | 109860367 A | 6/2019 |
| CN | 102842667 A | 12/2021 |
| TW | 201029226 A | 8/2010 |

OTHER PUBLICATIONS

Search Report issued to PCT application No. PCT/CN2019/092366 on Nov. 13, 2019.
Search Report issued to PCT application No. PCT/CN2019/092368 on Oct. 28, 2019.

* cited by examiner

LIGHT-EMITTING DEVICE

CROSS-REFERENCE TO RELATED APPLICATION

This application is a continuation of U.S. patent application Ser. No. 17/360,956, filed on Jun. 28, 2021, which is a bypass continuation-in-part application based on PCT International Application No. PCT/CN2019/074690 which was filed on Feb. 3, 2019, and PCT International Application No. PCT/CN2019/092364, PCT International Application No. PCT/CN2019/092366 and PCT International Application No. PCT/CN2019/092368 which were filed on Jun. 21, 2019. PCT International Application No. PCT/CN2019/092364 claims priority of Chinese Invention Patent Application No. 201910108696.2 filed on Feb. 3, 2019. PCT International Application No. PCT/CN2019/092366 claims priority of Chinese Invention Patent Application No. 201910108701.X filed on Feb. 3, 2019. PCT International Application No. PCT/CN2019/092368 claims priority of Chinese Invention Patent Application No. 201910108698.1 filed on Feb. 3, 2019. The entire contents of all of the above-referenced Applications are incorporated herein by reference.

FIELD

The disclosure relates to a semiconductor device, and more particularly to a light-emitting device.

BACKGROUND

A light-emitting diode (LED) has been widely used in a solid-state light emitting device. Compared with a conventional light source, e.g., incandescent light bulb and fluorescent lamp, the LED has many advantages, such as low power consumption, and long service life. As such, the LED has gradually replaced the conventional light source in various applications, e.g., traffic light, backlight module, street light, and medical equipment.

Referring to FIG. 1, a conventional light-emitting device includes a lead frame 110, an LED chip 120, and an encapsulant 130. The lead frame 110 includes a bottom wall 111 and a surrounding wall 112, and a mounting region 1101, a first wiring bonding region 1102 and a second wiring bonding region 1103 are disposed on an upper surface of the bottom wall 111. The first wiring bonding region 1102 and the second wiring bonding region 1103 are electrically isolated from each other. The LED chip 120 has a horizontal (i.e., lateral) structure and is disposed on the mounting region 1101. The LED chip 120 has a semiconductor light-emitting unit, and two electrodes 121 (a p-electrode and an n-electrode). The electrodes 121 are disposed on an upper surface (i.e., a light-emitting surface) of the semiconductor light-emitting unit and are connected to the first wiring bonding region 1102 and the second wiring bonding region 1103 through two wires 141, 142, respectively. The encapsulant 130 encapsulates the LED chip 120 on the lead frame 110. The bottom wall 111 and the surrounding wall 112 cooperate to form an accommodating space that is used to accommodate the LED chip 120. Nevertheless, the conventional light-emitting device has the following shortcomings. First, a light emitted from the LED chip 120 might be blocked or absorbed by the two electrodes 121. Secondly, the semiconductor light-emitting unit might be adversely affected during wire bonding since the electrodes 121 are disposed on the upper surface of the semiconductor light-emitting unit. Thirdly, a light emitted from the LED chip 120 and reflected by the surrounding wall 112 of the lead frame 110 or the encapsulant 130 easily enters a substrate of the LED chip 120, thereby being absorbed by the substrate of the LED chip 120 or the lead frame 110.

Referring to FIG. 2, another conventional light-emitting device is generally similar to the aforesaid conventional light-emitting device, except that in this light-emitting device, the LED chip 120 has a flip-chip structure, and the two electrodes 121 are in contact with two connector pads (not shown) on the bottom wall 111 of the lead frame 110. The connector pads are electrically isolated from each other. In such light-emitting device, a light emitted from the LED chip 120 would not be blocked or absorbed by the electrodes 121. However, in the manufacturing process of such light-emitting device, a specialized equipment and alignment step are required for positioning the LED chip 120 on the lead frame 110.

SUMMARY

An object of the disclosure is to provide a light-emitting device that can alleviate or eliminate at least one of the drawbacks of the prior art.

According to the disclosure, a light-emitting device includes a lead frame, a light-emitting diode (LED) chip, and an encapsulant. The lead frame includes a mounting region, a first wiring bonding region, and a second wiring bonding region that is electrically isolated from the first wiring bonding region. The LED chip is disposed on the mounting region of the lead frame, and includes a substrate, a semiconductor light-emitting unit, a first electrode, and a second electrode. The semiconductor light-emitting unit is disposed on a surface of the substrate. The first electrode and the second electrode are disposed on the surface of the substrate, and are located at two opposite sides of the semiconductor light-emitting unit. The first electrode and the second electrode are electrically connected to a lower surface of the semiconductor light-emitting unit, and are respectively connected to the first wiring bonding region and the second wiring bonding region through two wires. The encapsulant encapsulates the LED chip on the lead frame.

According to a second aspect of the disclosure, a light-emitting device includes a lead frame, an LED chip, and an encapsulant. The lead frame includes a mounting region. The LED chip is disposed on the mounting region of the lead frame, and includes a substrate, a semiconductor light-emitting unit, a first light-reflective layer and a second light-reflective layer. The first light-reflective layer is disposed between the semiconductor light-emitting unit and the substrate. The second light-reflective layer is disposed between the first light-reflective layer and the substrate. A first distance between the first light-reflective layer and a light-emitting surface of the LED chip is not greater than a second distance between the second light-reflective layer and the light-emitting surface of the LED chip. The second distance between the second light-reflective layer and the light-emitting surface of the LED chip is not greater than a half of a thickness of the LED chip. The encapsulant encapsulates the LED chip on the lead frame.

According to a third aspect of the disclosure, a light-emitting device includes a lead frame, an LED chip, an encapsulant, a second light-reflective layer, and a third light-reflective layer. The lead frame includes a mounting region. The LED chip is disposed on the mounting region of the lead frame, and includes a substrate, a semiconductor light-emitting unit. The second light-reflective layer is disposed on the substrate. The third light-reflective layer is disposed opposite to the second light-reflective layer and between a bottom wall of the lead frame and the substrate, such that a light emitted from the semiconductor light-emitting unit and reflected by the encapsulant enters the substrate, the light is permitted to be directed to leave the substrate through a light reflection between the second light-reflective layer and the third light-reflective layer. The encapsulant encapsulates the LED chip on the lead frame.

According to a fourth aspect of the disclosure, a light-emitting device includes a lead frame, at least two LED chips, and an encapsulant. A light is emitted from each of the at least two LED chips at a light-emitting angle that is not greater than 120°. The first distance between a first light-reflective layer and a light-emitting surface of the LED chip is not greater than 10 µm. The encapsulant encapsulates the LED chip on the lead frame.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
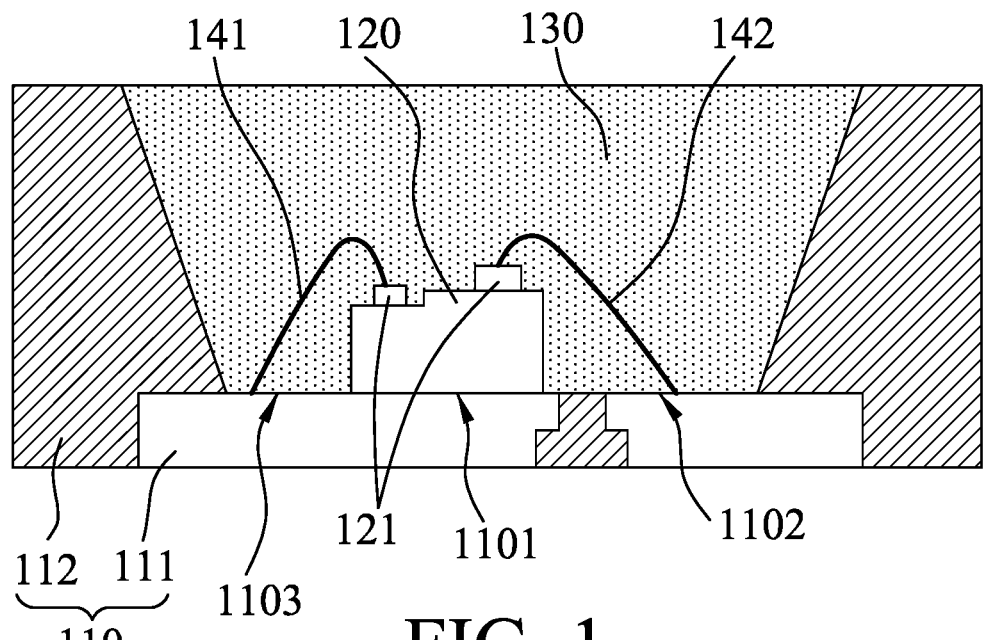
FIG. 1 is a schematic view illustrating a conventional light-emitting device.
Figure 2:
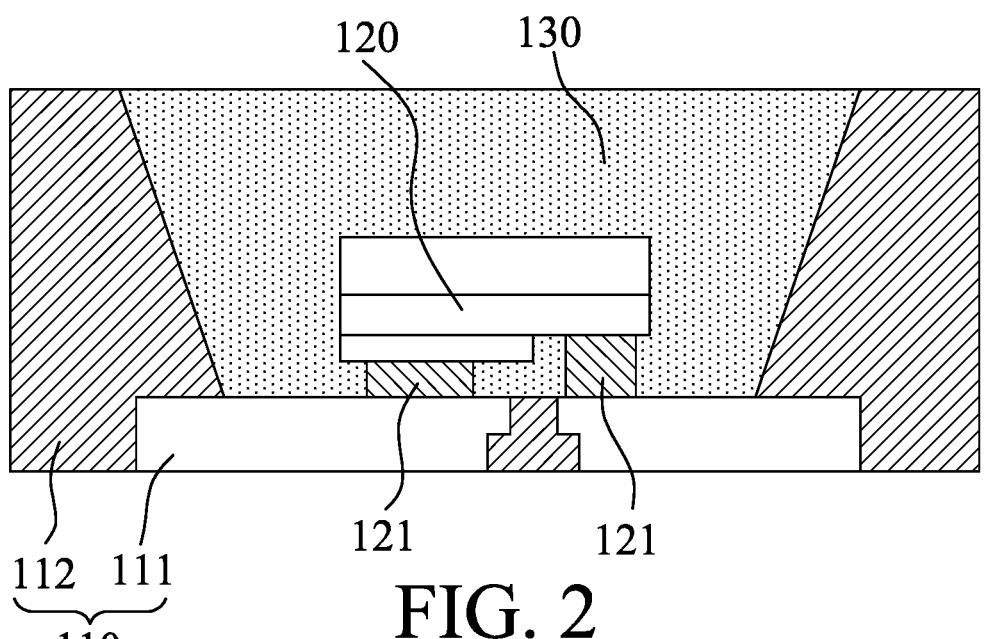
FIG. 2 is a schematic view illustrating another conventional light-emitting device.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
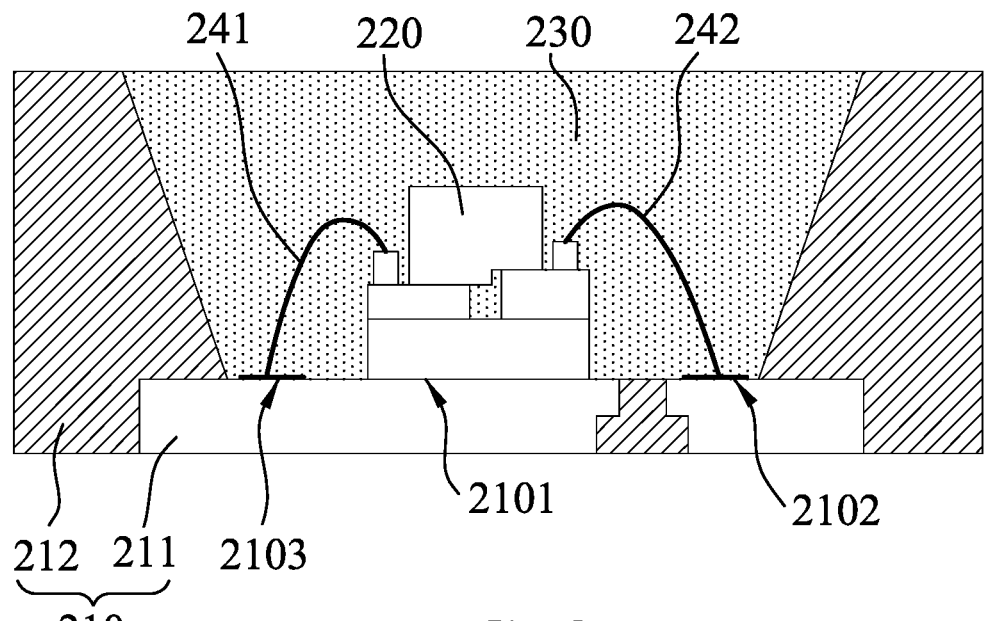
FIG. 3 is a schematic view illustrating a first embodiment of a light-emitting device according to the disclosure.
Figure 4:
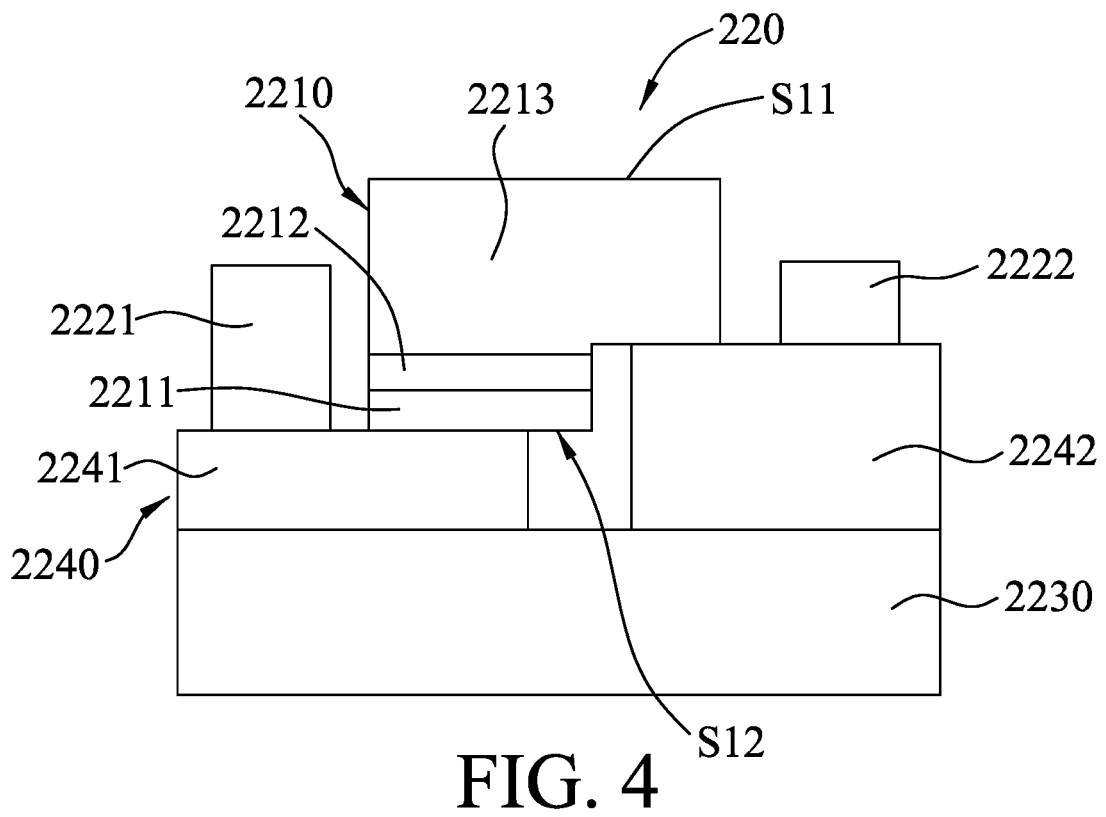
FIG. 4 is a schematic view illustrating a light-emitting diode (LED) chip of the first embodiment.

Referring to FIGS. 3 and 4, a first embodiment of a light-emitting device according to the present disclosure is shown to include a lead frame 210, a light-emitting diode (LED) chip 220, and an encapsulant 230. The encapsulant 230 encapsulates the LED chip 220 on the lead frame 210.

The lead frame 210 includes a bottom wall 211 and a surrounding wall 212, and a mounting region 2101, a first wiring bonding region 2102, and a second wiring bonding region 2103 are formed on an upper surface of the bottom wall 211. Specifically, the bottom wall 211 and a surrounding wall 212 cooperate to form a cup structure. The mounting region 2101 is located between the first wiring bonding region 2102 and the second wiring bonding region 2103. The second wiring bonding region 2103 is electrically isolated from the first wiring bonding region 2102.

The LED chip 220 is disposed on the mounting region 2101 of the lead frame 210. As shown in FIG. 4, the LED chip 220 includes a substrate 2230, a semiconductor light-emitting unit 2210, a first electrode 2221, and a second electrode 2222.

The substrate 2230 is used to support the semiconductor light-emitting unit 2210. The substrate 2230 may have a thickness ranging from 50 µm to 200 µm. In some embodiments, the thickness of the substrate 2230 may range from 50 µm to 100 µm, such as 90 µm. In some embodiments, the thickness of the substrate 2230 may range from 100 µm to 150 µm, such as 120 µm and 130 µm. In some embodiments, the thickness of the substrate 2230 may range from 150 µm to 200 µm, such as 180 µm. The substrate 2230 may be made of an insulating material, a light-transmissive material (e.g., sapphire, ceramic, or glass), or a highly reflective material. It is noted that a thickness of the LED chip 220 may vary depending on the thickness of the substrate 2230.

The semiconductor light-emitting unit 2210 is disposed on a surface of the substrate 2230. The semiconductor light-emitting unit 2210 is formed as a thin film structure, and is supported by the substrate 2230 without a growth substrate. The term "without a growth substrate" means that the growth substrate, which is used to grow the semiconductor light-emitting unit 2210, may be removed or greatly thinned.

Specifically, the semiconductor light-emitting unit 2210 has an upper surface S11 and a lower surface S12. The upper surface S11 serves as a light-emitting surface and is opposite to the lower surface S12. The semiconductor light-emitting unit 2210 includes a first type semiconductor layer 2211, a second type semiconductor layer 2213, and a light-emitting layer 2212 sandwiched between the first type semiconductor layer 2211 and the second type semiconductor layer 2213. The first type semiconductor layer 2211 and the second type semiconductor layer 2213 are distal from and proximate to the substrate 2230, respectively. In some embodiments, the first type semiconductor layer 2211 is a p-type semiconductor layer, and the second type semiconductor layer 2213 is an n-type semiconductor layer. In alternative embodiments, the first type semiconductor layer 2211 can be the n-type semiconductor layer and the second type semiconductor layer 2213 can be the p-type semiconductor layer. Examples of a material for making the first type semiconductor layer 2211 and the second type semiconductor layer 2213 may include, but are not limited to, a semiconductor nitride represented by $Al_xIn_yGa_{(1-x-y)}N$ ($0 \leq x \leq 1$, $0 \leq y \leq 1$, and $0 \leq x+y \leq 1$), a gallium arsenide (GaAs)-based semiconductor material, a gallium phosphide (GaP)-based semiconductor material (e.g., aluminium gallium indium phosphide (AlGaInP)), or the like. The light-emitting layer 2212 may be formed as a nitride-based multiple quantum well structure (MQW). Examples of a material for making the light-emitting layer 2212 may include, but are not limited to, indium gallium nitride (InGaN)/gallium nitride (GaN), GaN/aluminium gallium nitride (AlGaN), GaAs/aluminium gallium arsenide (AlGaAs), InGaP/GaP, GaP/aluminium gallium phosphide (AlGaP), or the like.

The first electrode 2221 and the second electrode 2222 are electrically connected to the lower surface S12 of the semiconductor light-emitting unit 2210, and are respectively connected to the first wiring bonding region 2102 and the second wiring bonding region 2103 through two wires 241, 242.

Specifically, the first electrode 2221 and the second electrode 2222 are disposed on the surface of the substrate 2230, and are located at two opposite sides (i.e., outwardly) of the semiconductor light-emitting unit 2210. In other words, a projection of each of the first electrode 2221 and the second electrode 2222 on the substrate 2230 falls outside a projection of the semiconductor light-emitting unit 2210 on the substrate 2230. In some embodiments, an upper surface of the first electrode 2221 is flush with an upper surface of the second electrode 2222.

By virtue of the first electrode 2221 and the second electrode 2222 locating outwardly of the semiconductor light-emitting unit 2210, a light emitted from the semiconductor light-emitting unit 2210 would not be directly blocked by the first electrode 2221 and the second electrode 2222, thereby avoiding a decrease in light-emitting efficiency of the light-emitting device and being conducive for subsequent wire bonding process.

In some embodiments, the lead frame 210 is formed with a recess, and the LED chip 220 is disposed within the recess. The encapsulant 230 is configured to fill the recess and to encapsulate the LED chip 220 on the lead frame 210.

In some embodiments, the LED chip 220 may further include an electrically connecting structure 2240 disposed between the semiconductor light-emitting unit 2210 and the substrate 2230, thereby permitting the first electrode 2221 and the second electrode 2222 to be electrically connected to the lower surface S12 of the semiconductor light-emitting unit 2210 through the electrically connecting structure 2240.

Specifically, the electrically connecting structure 2240 includes a first electrically connecting layer 2241 and a second electrically connecting layer 2242. The first electrically connecting layer 2241 is disposed to permit the first electrode 2221 to be electrically connected to the first type semiconductor layer 2211 through the first electrically connecting layer 2241. The second electrically connecting layer 2242 is disposed to permit the second electrode 2222 to be electrically connected to the second type semiconductor layer 2213 through the second electrically connecting layer 2242. The first electrically connecting layer 2241 and the second electrically connecting layer 2242 may be made of the same material or different materials. Examples of a material for making each of the first electrically connecting layer 2241 and the second electrically connecting layer 2242 may include, but are not limited to, reflective metallic materials (e.g., silver (Ag), or aluminium (Al)), metal cladding materials for preventing metal diffusion (e.g., titanium (Ti), platinum (Pt), gold (Au), chromium (Cr), or tungsten titanium (TiW)), ohmic contact materials (e.g., Cr, nickel (Ni), or Au), and combinations thereof. In some embodiments, the LED chip 220 may further include a transparent current spreading layer (not shown) disposed between the first electrically connecting layer 2241 and the first type semiconductor layer 2211 to reduce an electrical resistance therebetween. In some embodiments, the second electrically connecting layer 2242 may include an ohmic contact sublayer (not shown) that is made of a metallic material (e.g., Cr, Ni, Au, Al, or the like) and that has a good electrical connection with the second type semiconductor layer 2213.

In some embodiments, the substrate 2230 may be made of a thermally conductive material (e.g., silicon (Si), copper (Cu), or ceramic). Since an excited light radiation generated from the light-emitting layer 2212 is emitted through the second type semiconductor layer 2213, a heat may be easily accumulated in the second type semiconductor layer 2213. In such case, the electrically connecting structure 2240, the substrate 2230 made of a thermally conductive material, and the second type semiconductor layer 2213 cooperate to form a thermally conductive structure so as to direct the heat accumulated in the second type semiconductor layer 2213 to the substrate 2230.

Figure 5:
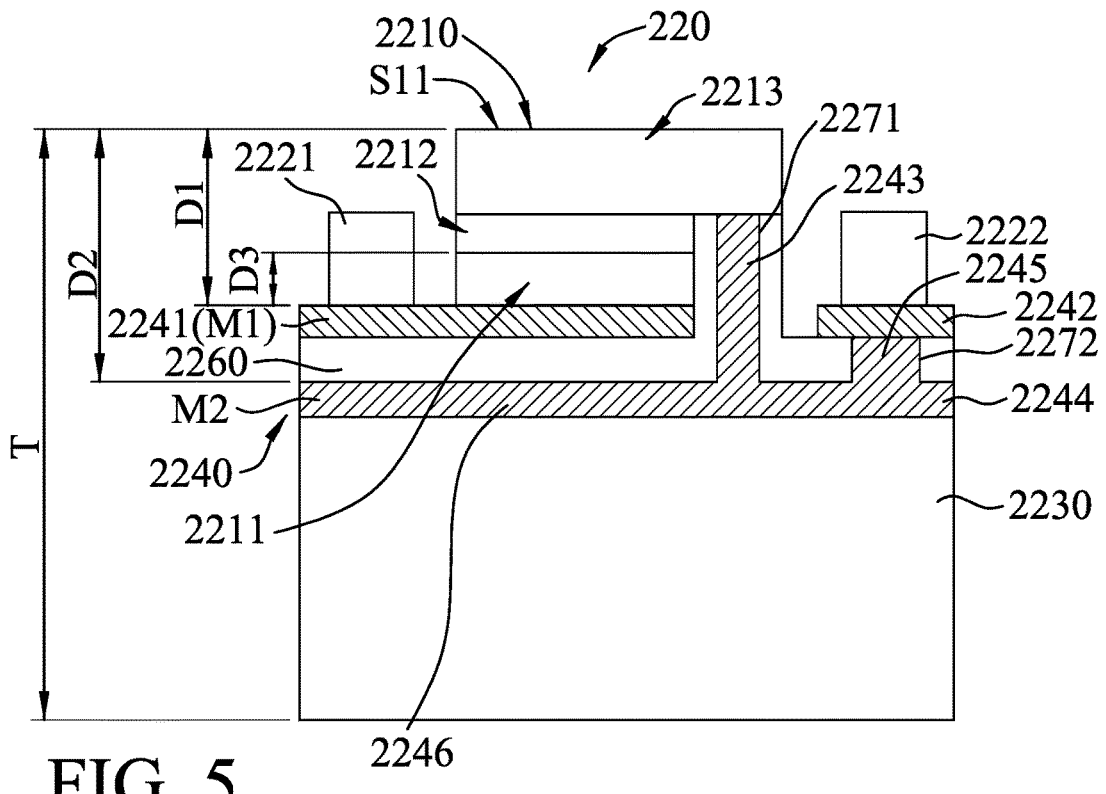
FIG. 5 is a schematic view illustrating a second embodiment of the light-emitting device according to the disclosure.

Referring to FIG. 5, a second embodiment of a light-emitting device according to the present disclosure is generally similar to the first embodiment, except for the following differences.

Specifically, the LED chip 220 further includes an insulating layer 2260, and the electrically connecting structure 2240 further includes a third electrically connecting layer 2244. The third electrically connecting layer 2244 includes a body portion 2246, a first branch portion 2243, and a second branch portion 2245. The body portion 2246 is separated from the first electrically connecting layer 2241 and the second electrically connecting layer 2242 through the insulating layer 2260. The first branch portion 2243 extends through the insulating layer 2260 to interconnect the body portion 2246 and the second type semiconductor layer 2213. The second branch portion 2245 extends through the insulating layer 2260 to interconnect the body portion 2246 and the second electrically connecting layer 2242 to thereby permit the second electrically connecting layer 2242 and the second electrode 2222 to be electrically connected to the second type semiconductor layer 2213 through the third electrically connecting layer 2244. In some embodiments, as shown in FIG. 5, the first branch portion 2243 extends through a first through hole 2271 of the insulating layer 2260 to interconnect the body portion 2246 and the second type semiconductor layer 2213. The second branch portion 2245 extends through a second through hole 2272 of the insulating layer 2260 to interconnect the body portion 2246 and the second electrically connecting layer 2242.

In some embodiments, the third electrically connecting layer 2244 may be made of a reflective metallic material which has a reflectivity that is not smaller than 70%, and may serve as a light-reflective layer. Examples of a material for making the third electrically connecting layer 2244 may include, but are not limited to, Al, Cr, Ag, or combinations thereof. In some embodiments, the third electrically connecting layer 2244 may be formed as a multi-layered structure. For example, the third electrically connecting layer 2244 may include a highly light-reflective sublayer that is in proximity to the semiconductor light-emitting unit 2210. In such case, the highly light-reflective sublayer may be made of Al, and may have a thickness that is not greater than 50 nm.

The first electrically connecting layer 2241 and the second electrically connecting layer 2242 may have the same thickness. In some embodiments, the first electrically connecting layer 2241 and the second electrically connecting layer 2242 may be made by the same process (e.g., a photolithography process). In some embodiments, the first electrically connecting layer 2241 and the second electrically connecting layer 2242 may be at the same level, which is conducive for subsequently making the first electrode 2221 and the second electrode 2222 with the same level.

The LED chip 220 may further include a first light-reflective layer M1 disposed between the semiconductor light-emitting unit 2210 and the substrate 2230. In some embodiments, the first electrically connecting layer 2241 may be disposed to serve as the first light-reflective layer M1. In alternative embodiments, the first electrically connecting layer 2241 may be formed as a multi-layered structure, one of which may serve as the first light-reflective layer M1. For example, the first electrically connecting layer 2241 may include a highly light-reflective sublayer that is made of Al and that has a thickness which is not greater than 50 nm.

A first distance (D1) between the first electrically connecting layer 2241 (also referred to as the first light-reflective layer M1), and the light-emitting surface of the LED chip 220 may be not greater than 10 μm. In some embodiments, the first distance (D1) may range from 4 μm to 8 μm. A third distance (D3) between the first electrically connecting layer 2241 (also referred to as the first light-reflective layer M1) and the light-emitting layer 2212 may be not greater than 5 μm. In some embodiments, the third distance (D3) may be not greater than 1 μm. As such, a light-transmitting path inside the LED chip 220 is shortened, and a ratio of light emitted from the light-emitting layer 2212 to light leaving the upper surface S11 is increased. A light is emitted from the LED chip 220 at a light-emitting angle that may be not greater than 150°. In some embodiments, the light-emitting angle may be not greater than 120°. In some embodiments, the light-emitting angle may range from 110° to 120°, such as 113°, 115°, and 118°.

The LED chip 220 may further include a second light-reflective layer M2 disposed between the first light-reflective layer M1 and the substrate 2230. In some embodiments, the third electrically connecting layer 2244 may be disposed to serve as the second light-reflective layer M2. A second distance (D2) between the third electrically connecting layer 2244 (also referred to as the second light-reflective layer M2) and the upper surface S11 may be not greater than 20 μm, and may be not greater than a half of a thickness (T) of the LED chip 220. In some embodiments, the second distance (D2) may range from 7 μm to 12 μm, such as 8 μm and 9 μm. In some embodiments, the LED chip 220 may further include a bonding layer 2280 (not shown) that is disposed between the third electrically connecting layer 2244 (also referred to as the second light-reflective layer M2) and the substrate 2230, and that is used for bonding the third electrically connecting layer 2244 to the substrate 2230. The bonding layer 2280 may be made from a metallic material to serve as a thermally conductive layer, thereby effectively transferring a heat accumulating in the second type semiconductor layer 2213 to the substrate 2230.

Figure 6:
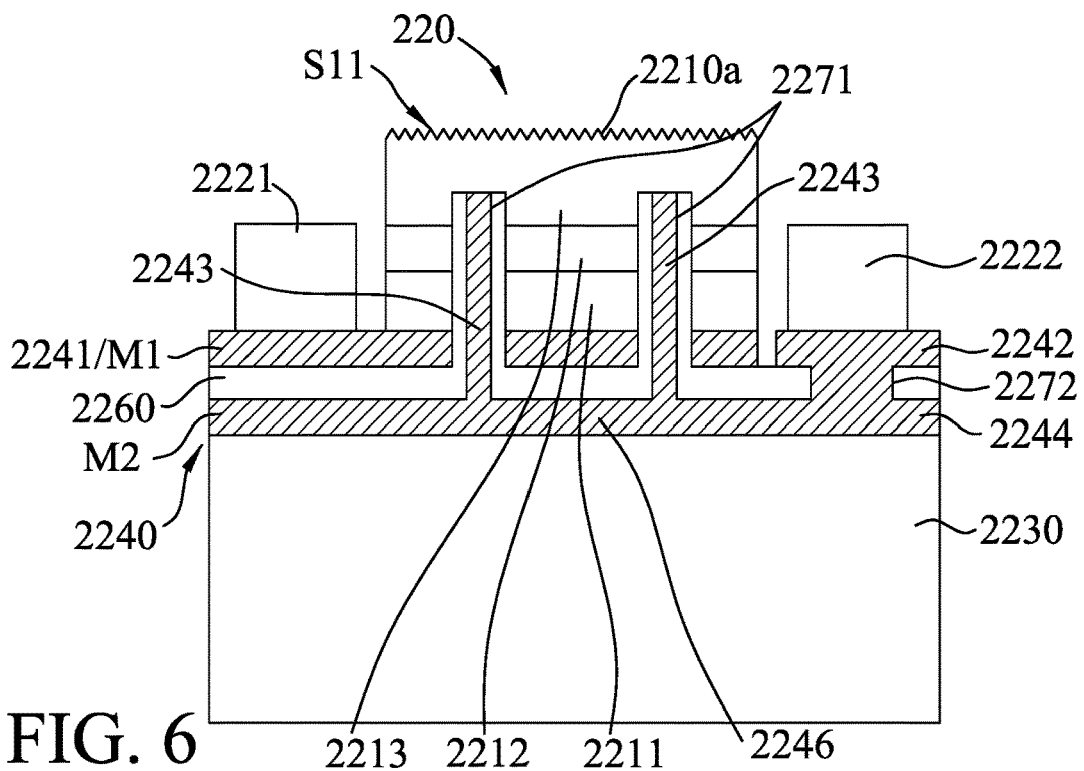
FIG. 6 is a schematic view illustrating a variation of the second embodiment.

Referring to FIG. 6, in a variation of the second embodiment, the third electrically connecting layer 2244 may include a plurality of the spaced-apart first branch portions 2243 and a plurality of the first through holes 2271 for extension of the first branch portions 2243, respectively. The spaced-apart first branch portions 2243 may be uniformly distributed within the LED chip 220, such that the LED chip 220 exhibits an improved current spreading function and an improved thermal conductivity, which is adapted to be used at high current density.

In some embodiments, a ratio of a contact area between the third electrically connecting layer 2244 and the second type semiconductor layer 2213 to a lower surface area of the second type semiconductor layer 2213 may be not smaller than 1.5%, such as ranging from 2.3% to 2.8%, ranging from 2.8% to 4%, and ranging from 4% to 6%. The contact area between the third electrically connecting layer 2244 and the second type semiconductor layer 2213 may be increased, which is conducive for enhancing a thermal conductivity of a high power LED chip (e.g., a large scale LED chip, or a high voltage LED chip).

In some embodiments, as shown in FIG. 6, a diameter of each of the first branch portions 2243 may not be smaller than 15 μm. It is noted that when each of the first branch portions 2243 has an undue smaller diameter, the first branch portions 2243 may have an over-proportional increase in thermal resistance. Therefore, the diameter of each of the first branch portions 2243 may range from 32 μm to 40 μm to thereby achieve a better thermally conductive effect. In some embodiments, when the diameter of each of the first branch portions 2243 ranges from 32 μm to 36 μm, a number of the first branch portions 2243 disposed within the LED chip 220 may range from 20 to 25. In some embodiments, a contact surface between each of the first branch portions 2243 and the second type semiconductor layer 2213 may be formed with a mirror structure.

In some embodiments, as shown in FIG. 6, the first electrically connecting layer 2241 and the second electrically connecting layer 2242 may be disposed to simultaneously serve as the first light-reflective layer M1. In some embodiments, a portion of the third electrically connecting layer 2244 that is disposed near the semiconductor light-emitting unit 2210 may serve as the second light-reflective layer M2. In such case, the lower surface S12 of the semiconductor light-emitting unit 2210 are covered by the first light-reflective layer M1 (i.e., the first electrically connecting layer 2241 and the second electrically connecting layer 2242) and the second light-reflective layer M2 (i.e., the third electrically connecting layer 2244), and therefore, a light emitted from the light-emitting layer 2212 can be directly reflected by the first light-reflective layer M1 and the second light-reflective layer M2, and would not be absorbed by the substrate 2230. For example, the first electrically connecting layer 2241 and the second electrically connecting layer 2242 are made of Ag to serve as the first light-reflective layer M1, and the third electrically connecting layer 2244 is made of Al to form an ohmic contact with the second type semiconductor layer 2213 and to serve as the second light-reflective layer M2. The third electrically connecting layer 2244 can be used to cover an area of the lower surface S12 of the semiconductor light-emitting unit 2210 that is not covered by the first electrically connecting layer 2241 and the second electrically connecting layer 2242.

In some embodiments, as shown in FIG. 6, after removing a growth substrate (not shown) for the LED chip 220 to expose a surface thereof, the exposed surface of the LED chip 220 may be roughened to form a roughening surface 2210a which also serves as the light-emitting surface of the LED chip 220 (i.e., the upper surface S11 of the semiconductor light-emitting unit 2210).

Referring again to FIGS. 4 to 6, a size (or a cross-sectional area) of the substrate 2230 may be larger than a size (or a cross-sectional area) of the semiconductor light-emitting unit 2210. A thickness of the substrate 2230 of the LED chip 220 may be much larger than a thickness of the other structural layers. For example, in a gallium nitride (GaN)-based LED chip, the thickness of the substrate 2230 may be not smaller than 50 µm, such as 50 µm, 100 µm, 120 µm, 150 µm, and 180 µm; a thickness of the semiconductor light-emitting unit 2210 may be not greater than 10 µm, such as ranging from 4 µm to 8 µm; a sum of the thickness of the electrically connecting structure 2240, the insulating layer 2260, and the bonding layer (not shown) may not be greater than 5 µm, such as ranging from 3 µm to 5 µm. Therefore, a light emitted from the semiconductor light-emitting unit 2210 and reflected by the bottom wall 211 of the lead frame 210 or the encapsulant 230 may easily enter the substrate 2230, thereby being absorbed by metals above the substrate 2230, or by the lead frame 210.

Figure 7:
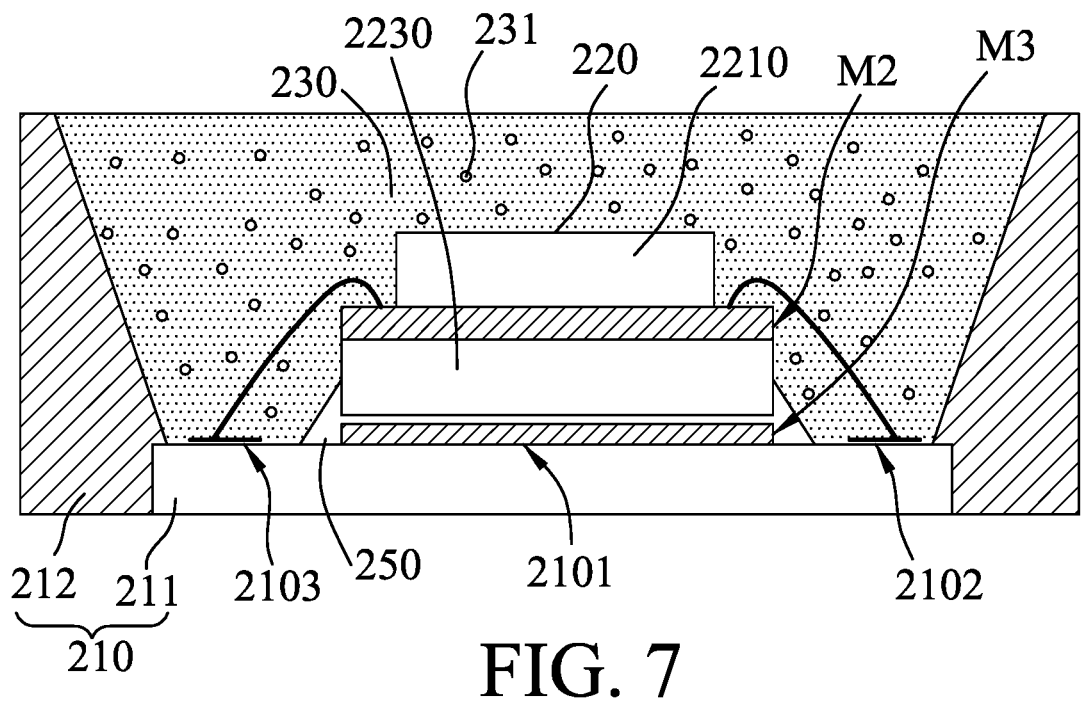
FIGS. 7 and 8 are schematic views illustrating a third embodiment of the light-emitting device according to the disclosure.

Referring to FIG. 7, a third embodiment of the light-emitting device according to the present disclosure is generally similar to the second embodiment, except that in the third embodiment, the light-emitting device further includes a third light-reflective layer M3 and an adhesive layer 250 that are disposed on the bottom wall 211 of the lead frame 210. The third light-reflective layer M3 is formed an upper surface of the mounting region 2101 to be disposed between the bottom wall 211 of the lead frame 210 and the substrate 2230. Examples of a material for making the third light-reflective layer M3 may include, but are not limited to, a metallic material (e.g., Au, or Al), an insulating material (e.g., a distributed Bragg reflector (DBR)), a light-reflective gel (e.g., a white glue), and combinations thereof. The third light-reflective layer M3 may have a thickness that is not greater than 5 µm. The adhesive layer 250 is used to securely fix the LED chip 220 to the bottom wall 211 of the lead frame 210 over the third light-reflective layer M3. The adhesive layer 250 may be made of a light-transmissive material which has a transmittance that is not smaller than 70%. In some embodiments, the transmittance of the adhesive layer 250 may not be smaller than 80%.

Figure 8:
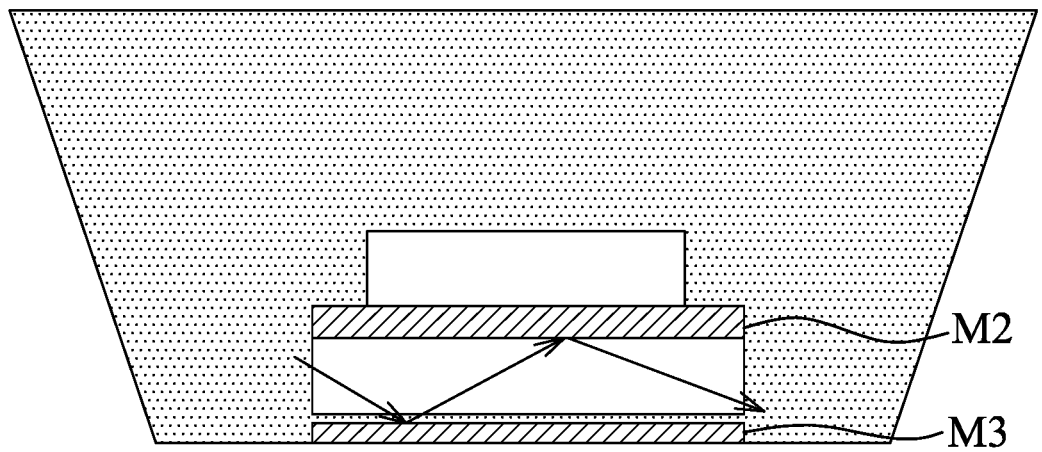

Referring to FIGS. 7 and 8, in some embodiments, the substrate 2230 of the LED chip 220 is light-transmissive, and is disposed between the second light-reflective layer M2 and the third light-reflective layer M3, such that once a light emitted from the semiconductor light-emitting unit 2210 and reflected by the encapsulant 230 enters the substrate 2230, the light is permitted to be directed to leave the substrate 2230 through a light reflection between the second light-reflective layer M2 and the third light-reflective layer M3. The substrate 2230 of the LED chip 220 may have a transmittance that is not smaller than 70%, 80% or 90%.

In some embodiments, the encapsulant 230 may include light-reflective particles 231 for reflecting or scattering a light emitted from the semiconductor light-emitting unit 2210 to a side of the substrate 2230 and to leave the substrate 2230 from the other side thereof. Therefore, the light is less likely to be absorbed by the above-mentioned bonding layer or the lead frame 210.

In some embodiments, the encapsulant 230 may include phosphor powders applied at top and around the LED chip 220 for reflecting or scattering a light emitted from the semiconductor light-emitting unit 2210 to a side of the substrate 2230. Similarly, the light is less likely to be absorbed by the above-mentioned bonding layer or the lead frame 210. Furthermore, in order to improve uniformity of a light emitted from the light-emitting device, the phosphor powder in the encapsulant 230 may be further distributed to a position beneath the second light-reflective layer M2.

Figure 9:
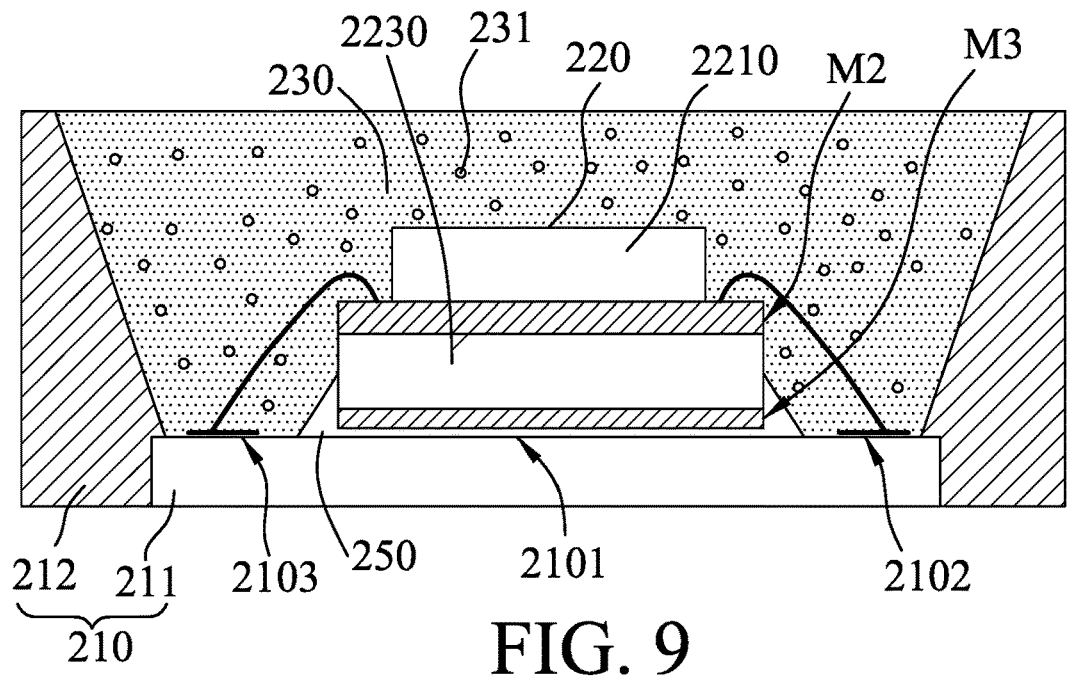
FIG. 9 is a schematic view illustrating a variation of the third embodiment.
Figure 10:
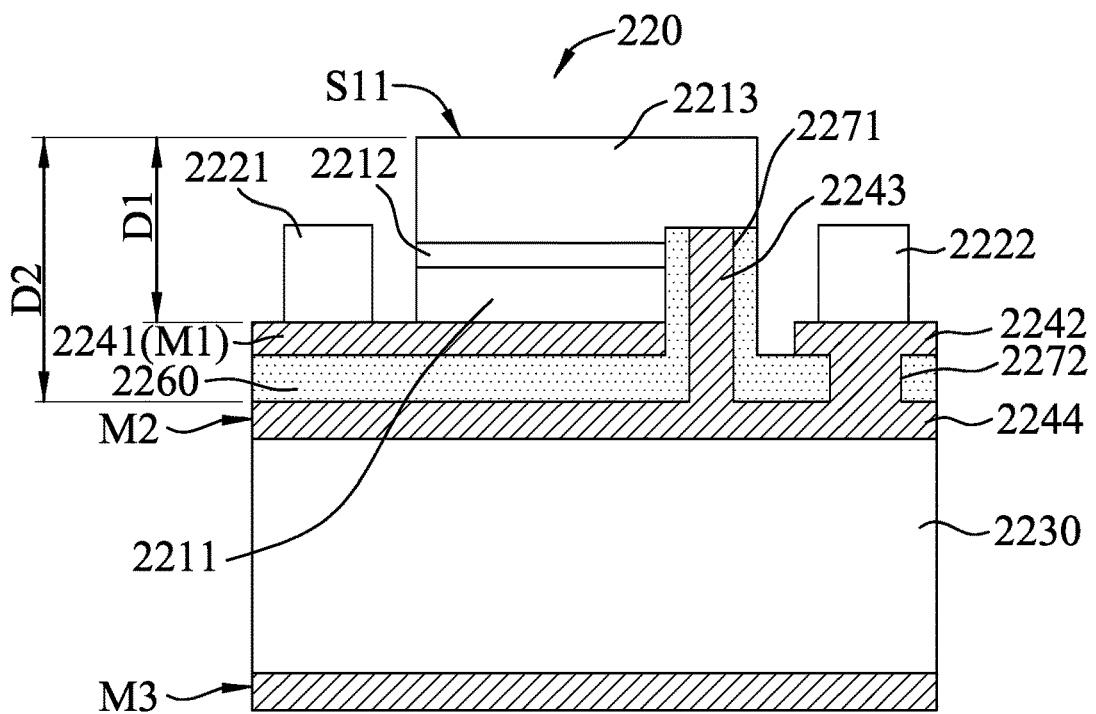
FIG. 10 is a schematic view illustrating the LED chip of FIG. 9.

Referring to FIGS. 9 and 10, in a variation of the third embodiment, the third light-reflective layer M3 is formed on a side of the substrate 2230 opposite to the second light-reflective layer M2.

Figure 11:
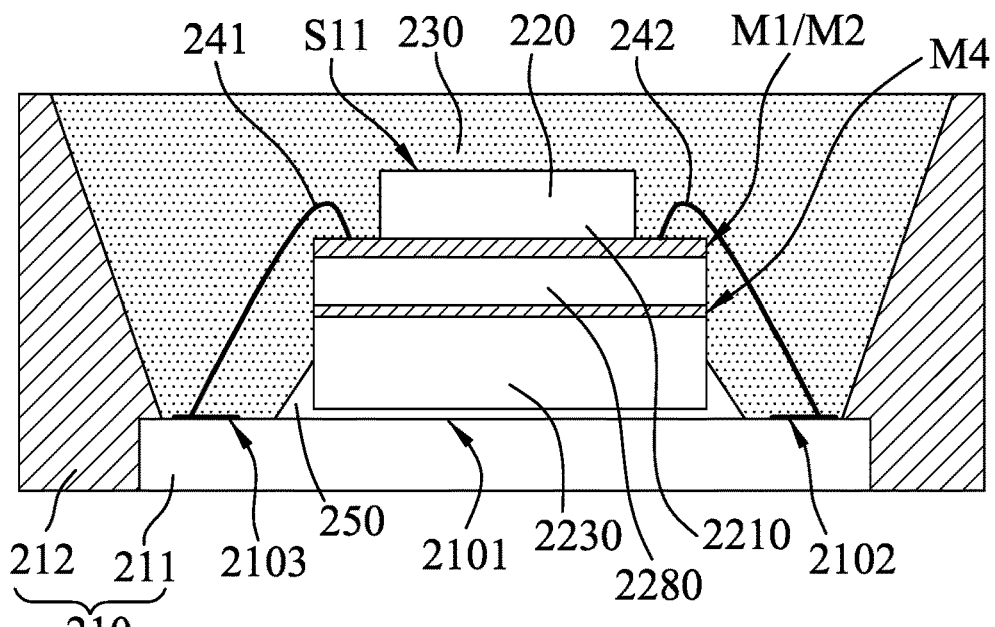
FIG. 11 is a schematic view illustrating a fourth embodiment of the light-emitting device according to the disclosure.
Figure 12:
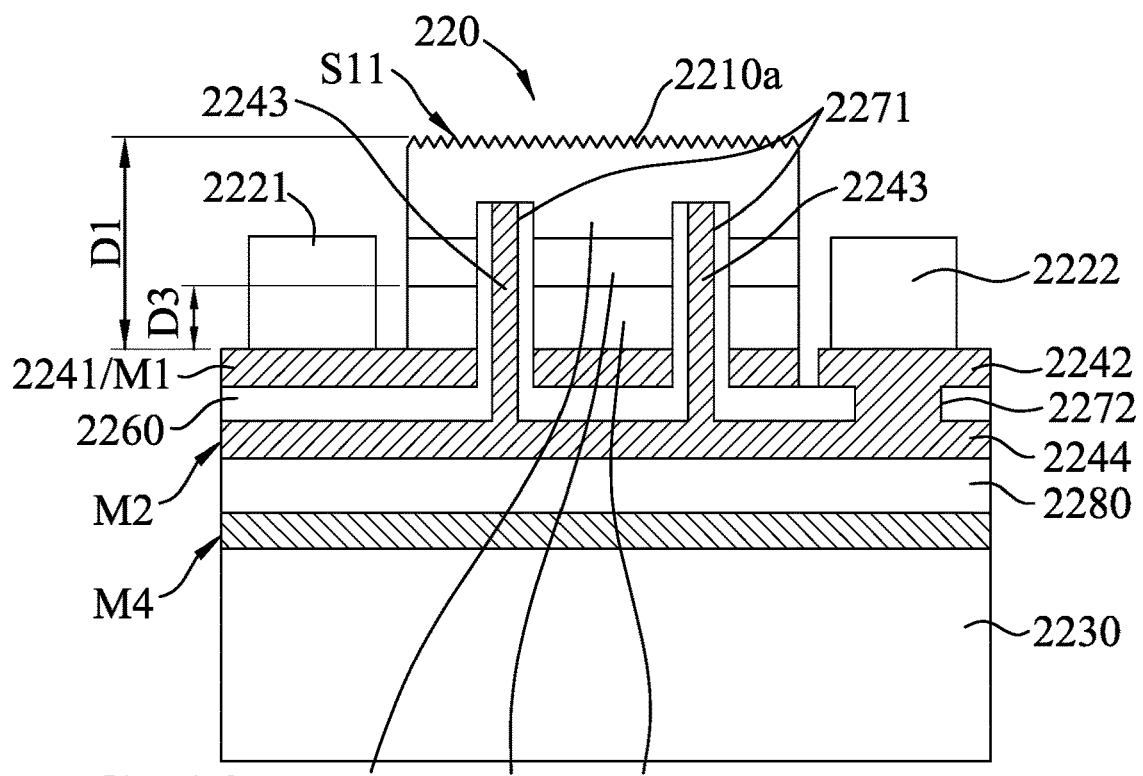
FIG. 12 is a schematic view illustrating the LED chip of the fourth embodiment.

Referring to FIGS. 11 and 12, a fourth embodiment of the light-emitting device according to the present disclosure is generally similar to the second embodiment, except that in the fourth embodiment, the LED chip 220 further includes a fourth light-reflective layer M4. In addition, the above-mentioned bonding layer is denoted by numeral 2280 in the fourth embodiment. Specifically, the bonding layer 2280, which is used to bond the semiconductor light-emitting unit 2210 to the substrate 2230, may be disposed between the third electrically connecting layer 2244 (also referred to as the second light-reflective layer M2) and the substrate 2230. In some embodiments, the bonding layer 2280 may be made of a metallic material, a non-metallic material, or an insulating material according to practical requirements. The fourth light-reflective layer M4 may be disposed between the bonding layer 2280 and the substrate 2230. The fourth light-reflective layer M4 may be made of a highly reflective metallic material (e.g., Al, or Ag).

In some embodiments, when the light-emitting device is used at a high current density that is not smaller than 1 A/mm² (e.g., 2 A/mm², or 3 A/mm²), the bonding layer 2280 may be made of a metal bonding material, and the fourth light-reflective layer M4 may be made of a highly reflective metallic material. In this case, the bonding layer 2280 and the fourth light-reflective layer M4 serve as a thermally conducting structure, which is conducive for directing a heat accumulated in the second type semiconductor layer 2213 to the lead frame 210 through the third electrically connecting layer 2244, the bonding layer 2280, the fourth light-reflective layer M4, and the substrate 2230. In alternative embodiments, the bonding layer 2280 may be made of an insulating material, and the fourth light-reflective layer M4 may be made of a metallic material or an insulating material.

Figure 13:
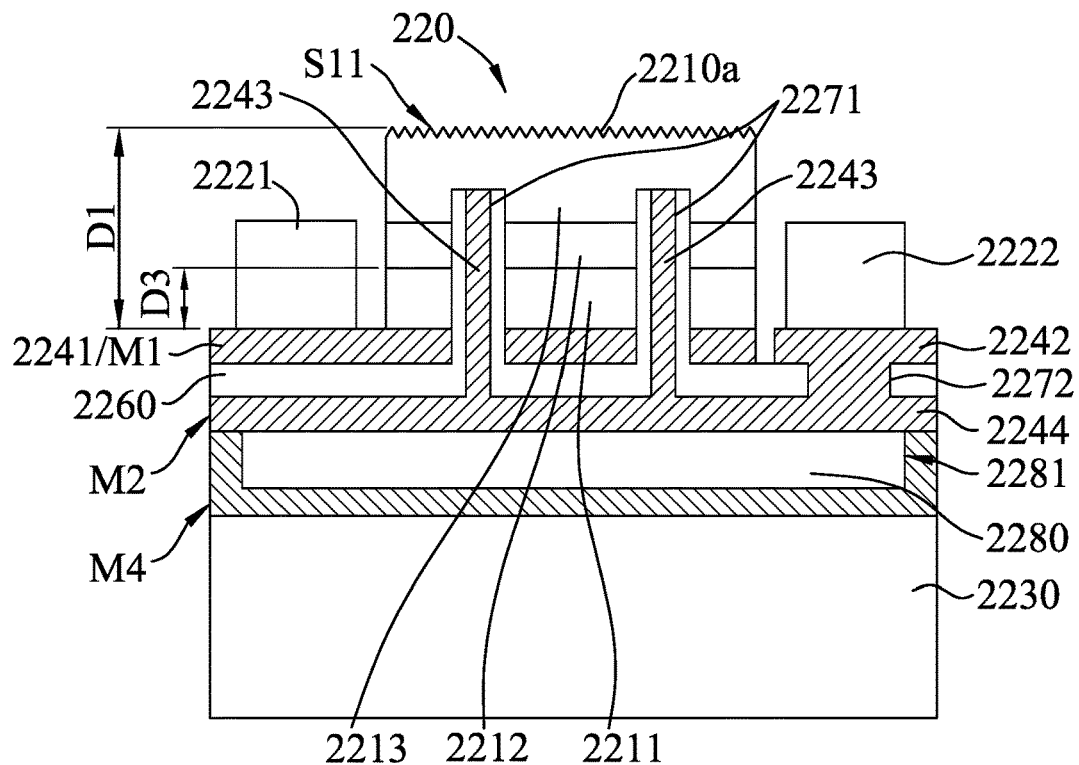
FIG. 13 is a schematic view illustrating a variation of the LED chip of the fourth embodiment.

Referring to FIG. 13, in a variation of the LED chip 220 of the fourth embodiment, a surrounding wall 2281 of the bonding layer 2280 is enclosed by the third electrically connecting layer 2244 (also referred to as the second light-reflective layer M2) and the fourth light-reflective layer M4. As such, once a light emitted from the semiconductor light-emitting unit 2210 is reflected or scattered by the surrounding wall 212 of the lead frame 210 or the encapsulant 230, the light may not transmit to the bonding layer 2280, since the light would be directly reflected by the third electrically connecting layer 2244 (also referred to as the second light-reflective layer M2) and the fourth light-reflective layer M4.

Figure 14:
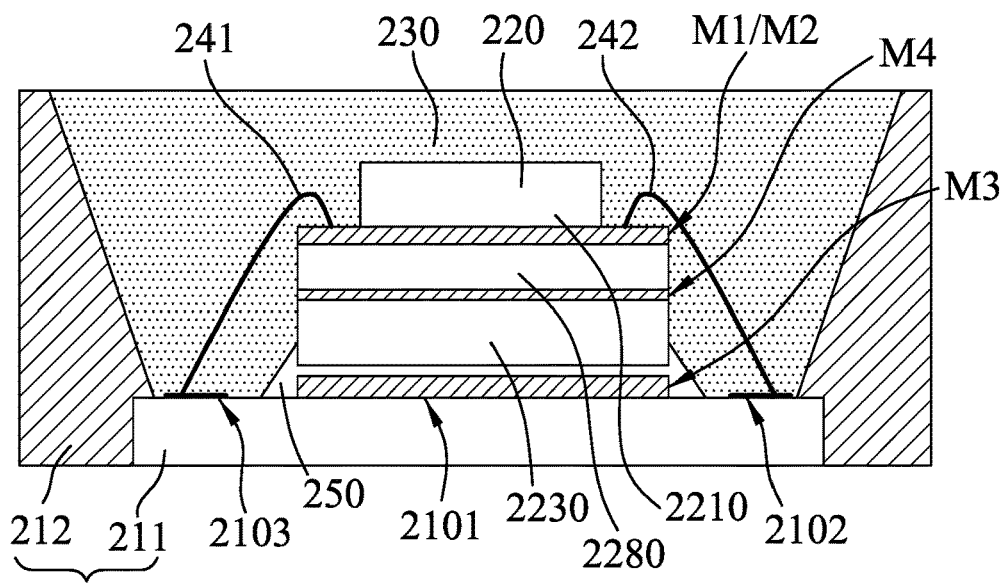
FIG. 14 is a schematic view illustrating a fifth embodiment of the light-emitting device according to the disclosure.

Referring to FIG. 14, a fifth embodiment of the light-emitting device according to the present disclosure is generally similar to the fourth embodiment, except that in the fifth embodiment, the light-emitting device further includes the third light-reflective layer M3 disposed on the mounting region 2101 of the lead frame 210. Specifically, the LED chip 220 may have a structure similar to those shown in FIGS. 12 and 13, and is disposed on the third light-reflective layer M3 through the adhesive layer 250. The third light-reflective layer M3 is disposed between the substrate 2230 and the lead frame 210. A distance between the third light-reflective layer M3 and the upper surface S11 of the LED chip 220 may not be smaller than 50 µm.

Figure 15:
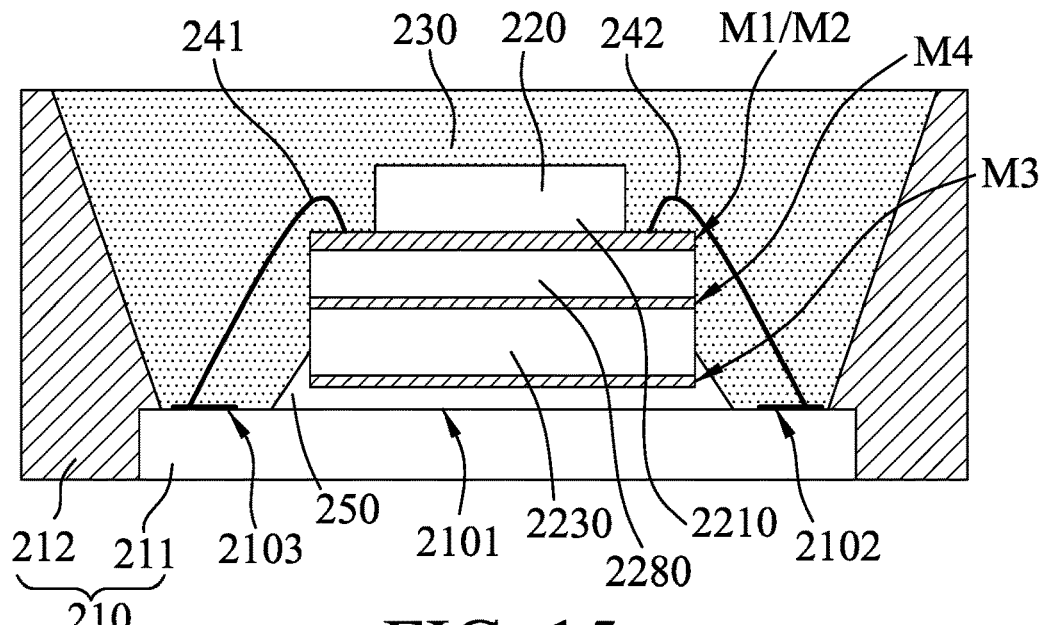
FIG. 15 is a schematic view illustrating a variation of the fifth embodiment.
Figure 16:
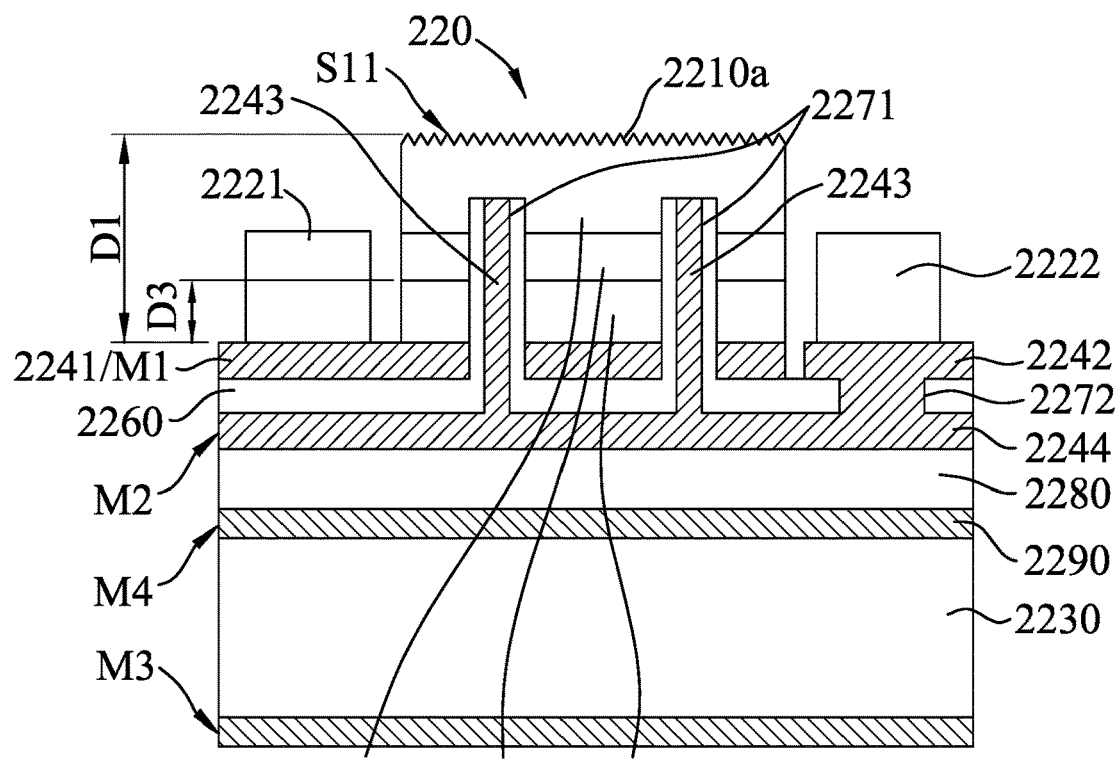
FIG. 16 is a schematic view illustrating the LED chip of FIG. 15.

Referring to FIGS. 15 and 16, in a variation of the fifth embodiment, the third light-reflective layer M3 is disposed between the adhesive layer 250 and the substrate 2230. The third light-reflective layer M3 may be disposed on a side of the substrate 2230 opposite to the fourth light-reflective layer M4.

Figure 17:
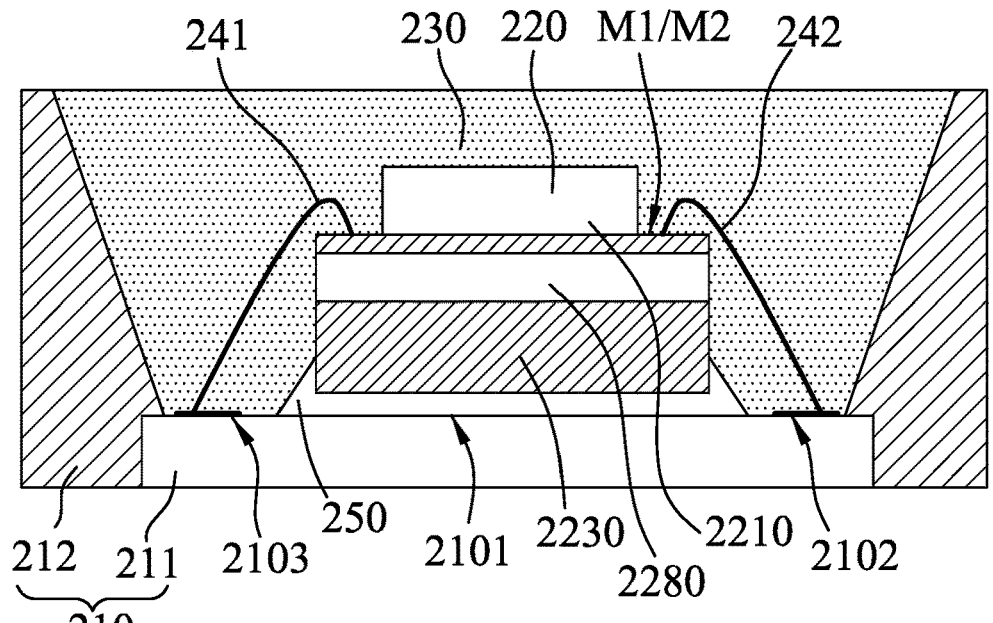
FIG. 17 is a schematic view illustrating a sixth embodiment of the light-emitting device according to the disclosure.

Referring to FIG. 17, a sixth embodiment of the light-emitting device according to the present disclosure is generally similar to the fourth embodiment, except that in the sixth embodiment, the substrate 2230 is a light-reflective substrate that has a reflectivity that is not smaller than 90%, such that when a light emitted from the LED chip 220 and reflected by the surrounding wall 212 of the lead frame 210 transmits to the substrate 2230, the light would be directly reflected by the substrate 2230, thereby reducing an amount of the light absorbed by the substrate 2230 or the lead frame 210. The substrate 2230 may be made of a white ceramic material. In addition, the adhesive layer 250 for adhering the LED chip 220 to the mounting region 2101 of the lead frame 210 may be made of a light-reflective material which has a reflectivity that is not smaller than 80%. The adhesive layer 250 may be a die-attach adhesive.

In some embodiments, the encapsulant 230 may include the light-reflective particles 231 or the phosphor powders, such that a portion of a light emitted from the LED chip 220 may be reflected or scattered to a side surface of the substrate 2230, or may be directly reflected outwardly.

Figure 18:
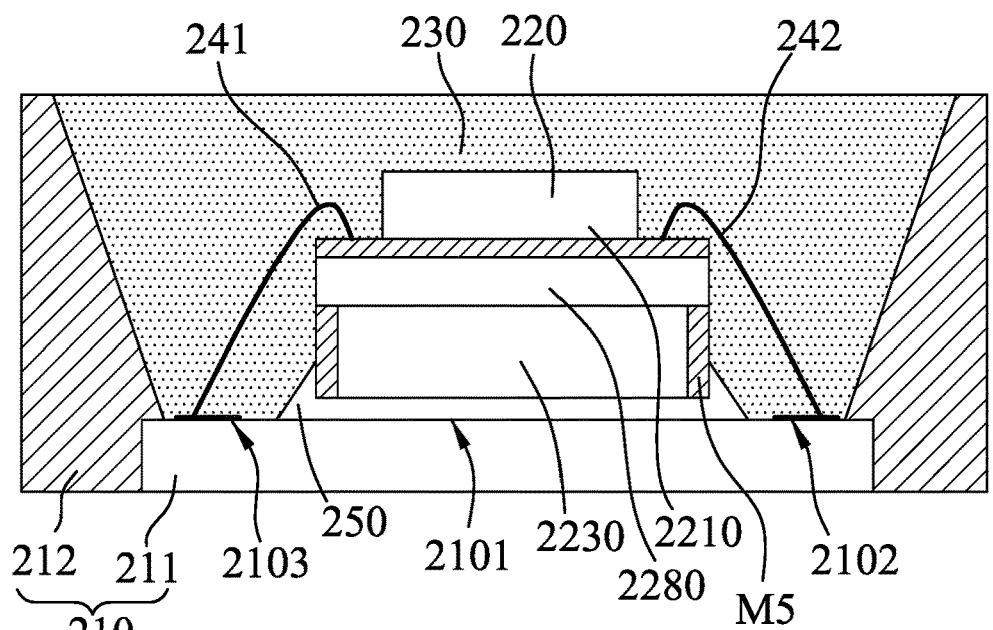
FIG. 18 is a schematic view illustrating a variation of the sixth embodiment.

Referring to FIG. 18, in a variation of the sixth embodiment, the LED chip 220 may include a fifth light-reflective layer M5 surrounding the substrate 2230. It is noted that the substrate 2230 can be made of a light-reflective material, a light-transmissive material (e.g., sapphire, or glass), a light-absorbing material (e.g., silicon), or combinations thereof.

Figure 19:
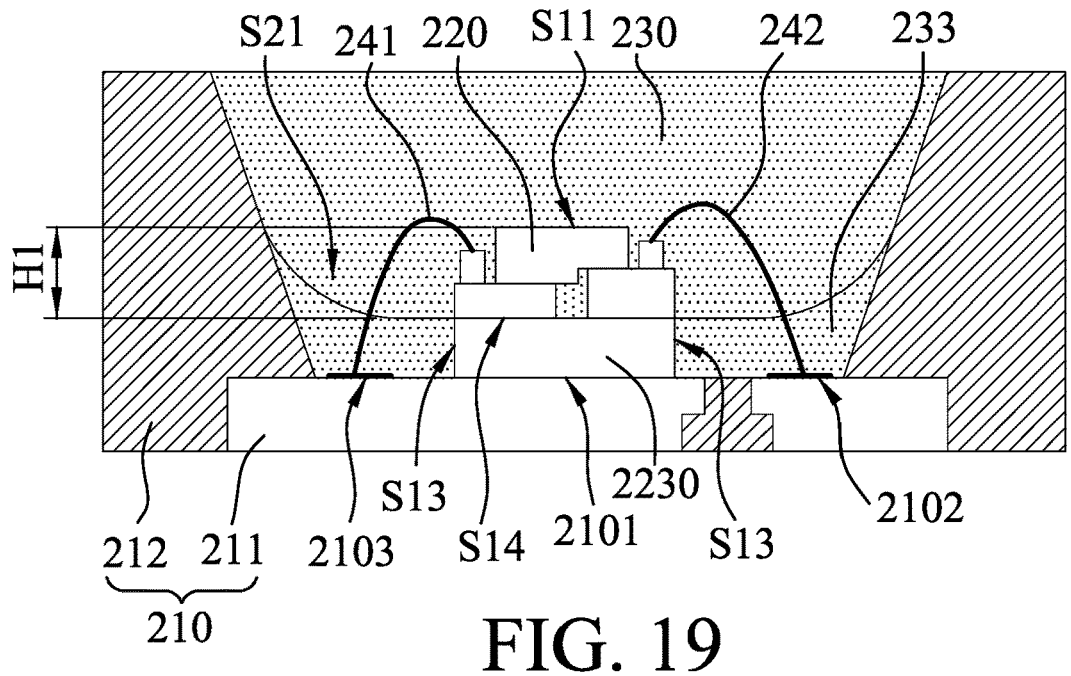
FIG. 19 is a schematic view illustrating a seventh embodiment of the light-emitting device according to the disclosure.

Referring to FIG. 19, a seventh embodiment of the light-emitting device according to the present disclosure is generally similar to the first embodiment, except that in the seventh embodiment, the light-emitting device further includes a reflective material layer 233 which is disposed between the lead frame 210 and the encapsulant 230, and which laterally encapsulates at least a portion of the LED chip 220. In some embodiments, the reflective material layer 233 laterally encapsulates a side surface S13 of the LED chip 220 to expose the upper surface S11 of the LED chip 220. The reflective material layer 233 may be made of one of a silicon resin, an epoxy, and a combination thereof (e.g., a white glue). In some embodiments, an upper surface S21 of the reflective material layer 233 may be located at a position that is not lower than an upper surface S14 of the substrate 2230, thereby effectively preventing a light emitted from the semiconductor light-emitting unit 2210 and reflected by the encapsulant 230 from entering the substrate 2230.

Figure 20:
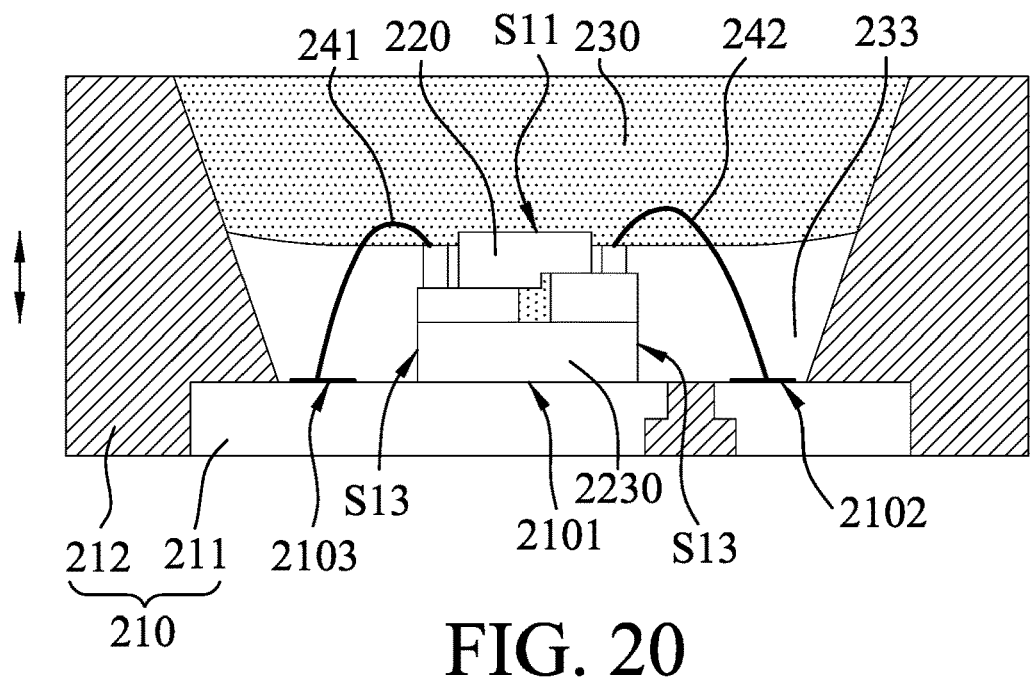
FIG. 20 is a schematic view illustrating a variation of the seventh embodiment.
Figure 21:
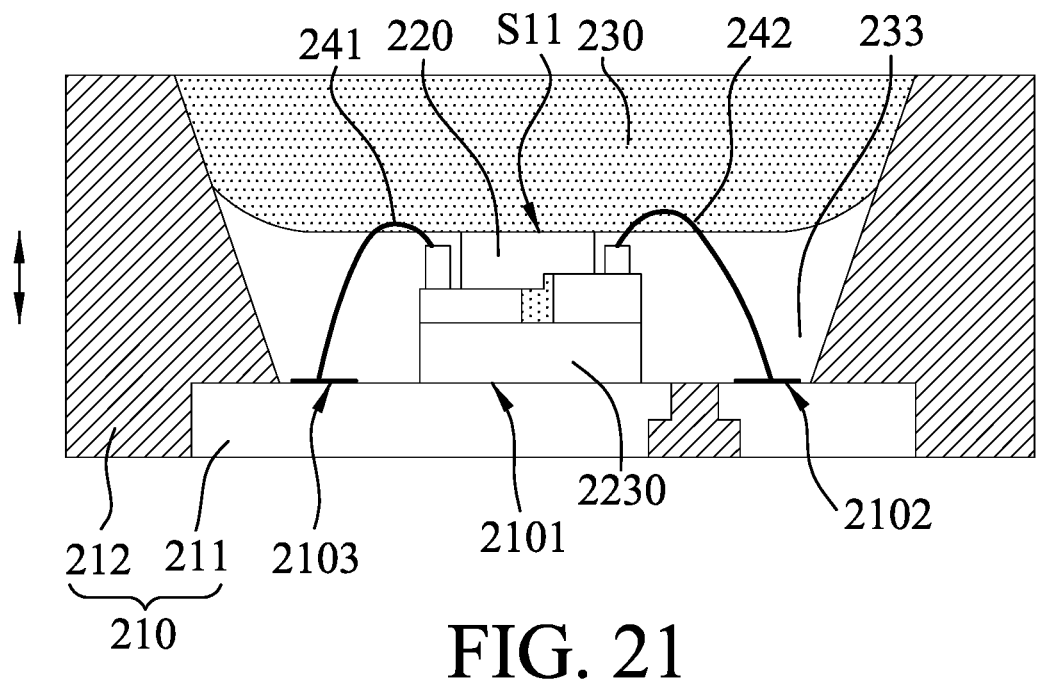
FIG. 21 is a schematic view illustrating another variation of the seventh embodiment.

In some embodiments, as shown in FIG. 19, a distance (H1) between the upper surface S21 of the reflective material layer 233 and the upper surface S11 of the LED chip 220 may be not greater than 20 µm. In some embodiments, the distance (H1) may be not greater than 10 µm. In a variation of the seventh embodiment shown in FIG. 20, the reflective material layer 233 laterally encapsulates the first electrode 2221 and the second electrode 2222 of the LED chip 220. In another variation of the seventh embodiment shown in FIG. 21, the reflective material layer 233 encapsulates the LED chip 220 to be flush with the upper surface S11 of the LED chip 220.

Figure 22:
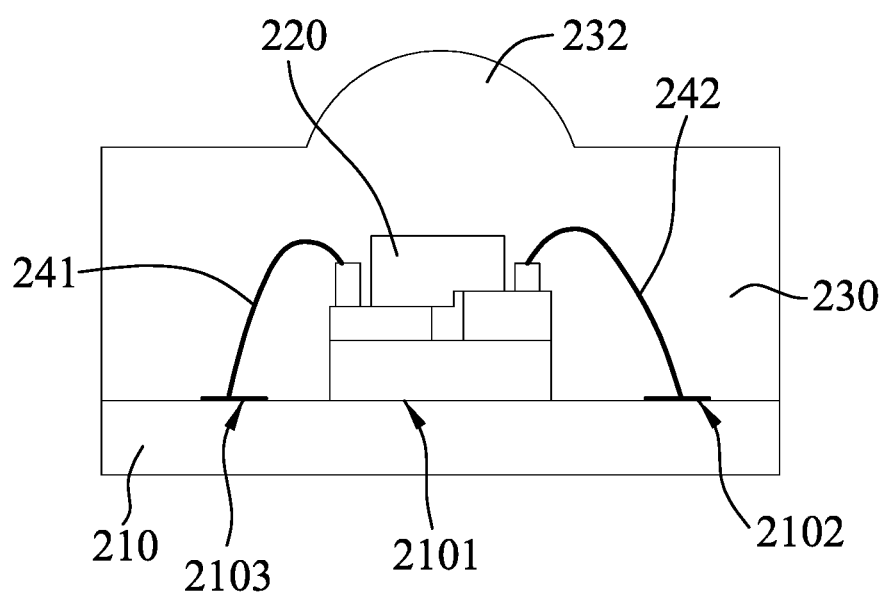
FIG. 22 is a schematic view illustrating an eighth embodiment of the light-emitting device according to the disclosure.

Referring to FIG. 22, an eighth embodiment of the light-emitting device according to the present disclosure is generally similar to the first embodiment, except that in the eighth embodiment, the lead frame 210 is formed as a flat structure. A portion of the encapsulant 230 may protrude upwardly to form a lens structure 232 that is disposed above the LED chip 220. The lens structure 232 and the encapsulant 230 may be made of the same or different material.

Figure 23:
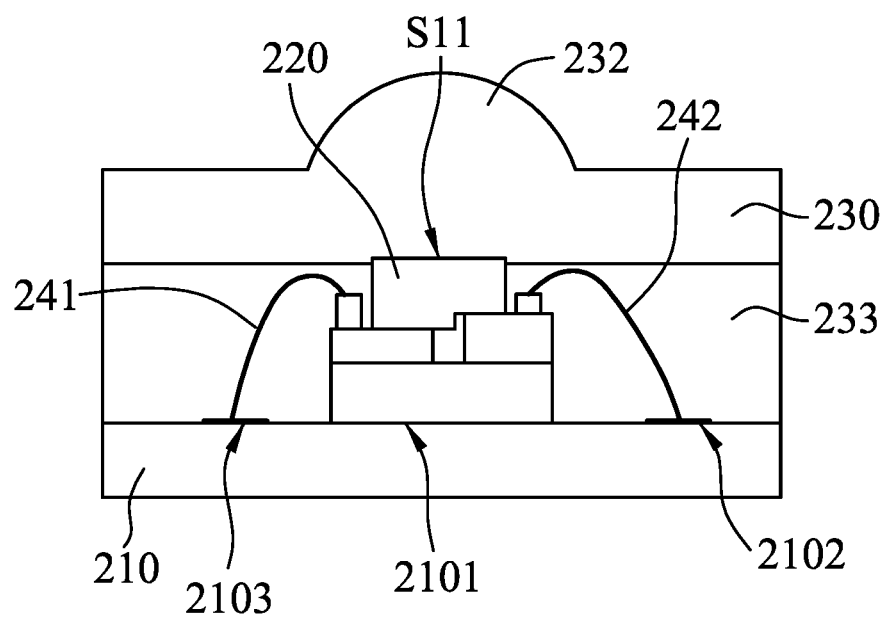
FIG. 23 is a schematic view illustrating a ninth embodiment of the light-emitting device according to the disclosure.

Referring to FIG. 23, a ninth embodiment of the light-emitting device according to the present disclosure is generally similar to the eighth embodiment, except that in the ninth embodiment, the light-emitting device further includes the reflective material layer 233 disposed between the lead frame 210 and the encapsulant 230, and laterally encapsulating the LED chip 220. The upper surface S21 of the reflective material layer 233 may be located at a position that is flush with or lower than the upper surface S11 of the LED chip 220.

Figure 24:
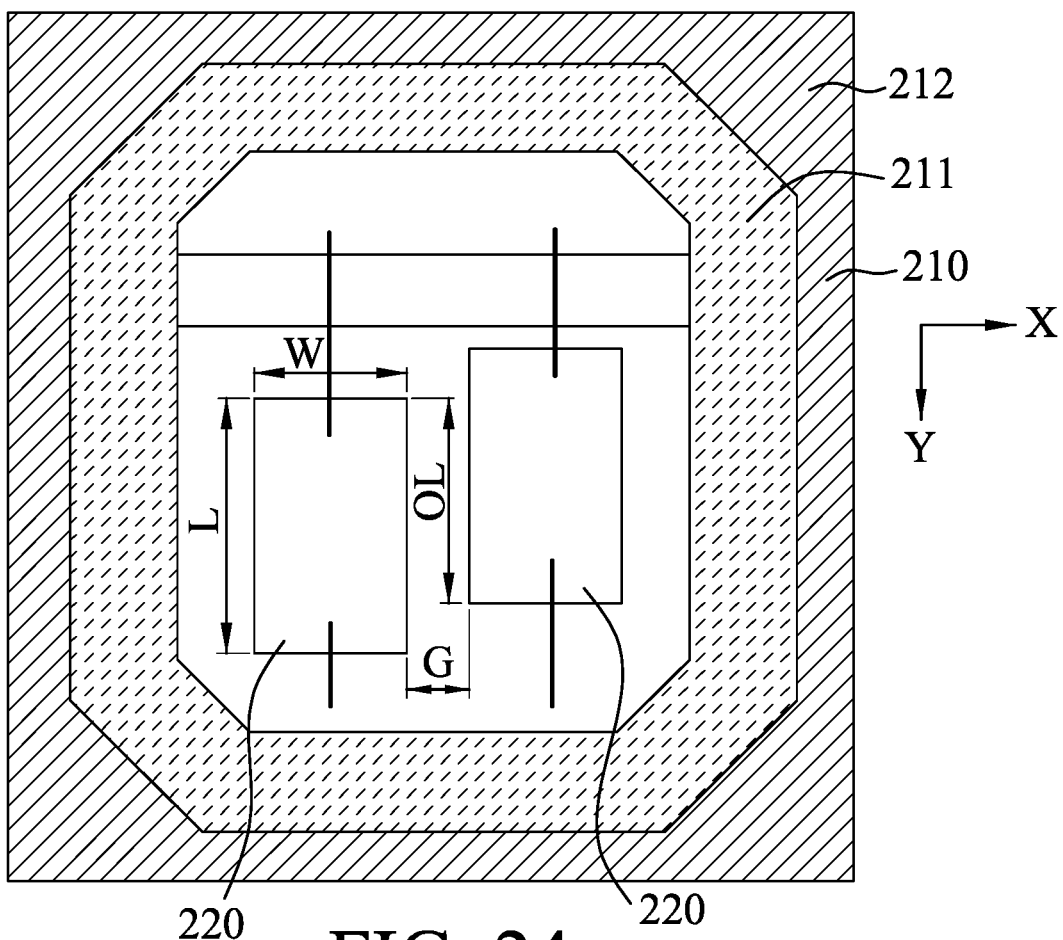
FIGS. 24 and 25 are schematic views illustrating a tenth embodiment of the light-emitting device according to the disclosure.
Figure 25:
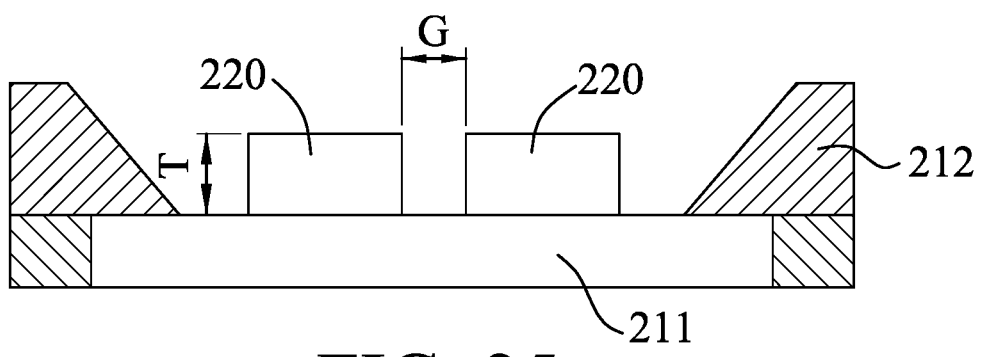

Referring to FIGS. 24 and 25, a tenth embodiment of the light-emitting device according to the present disclosure is generally similar to the first embodiment, except for the following differences.

The light-emitting device may include a plurality of the LED chips 220 disposed on the lead frame 210.

In this embodiment, the light-emitting device includes two LED chips 220 that extend in a longitudinal direction (Y), and that are spaced apart from each other in a transverse direction (X) relative to the longitudinal direction (Y). A light emitted from one of two LED chips 220 may be blocked by the other one of the two LED chips 220, and can be analyzed based on a light-blocking coefficient (R) which is obtained according to the following equation:

$$R = F1 \times F2$$

wherein:
F1=a first blocking factor which is proportional to a thickness (T) of the LED chip 220, and which is inversely proportional to a gap (G) defined between two LED chips 220; and
F2=a second blocking factor which is proportional to a ratio of an overlapping length (OL) of the two LED chips 220 in the transverse direction (X) to a perimeter (P) of each of the LED chips 220.

As shown in FIG. 24, each of the LED chips 220 has a width (W) in the transverse direction (X), and a length (L) in the longitudinal direction (Y). Thus, $$P = 2 \times (L + W).$$

The light blocking effect between the two LED chips 220 increases with an increased light-blocking coefficient (R).

In some embodiments, as shown in FIGS. 5, 6, 24, and 25, when a distance between the first light-reflective layer M1 and the upper surface S11 is not greater than 10 μm and a distance between the light-emitting layer 2212 and the upper surface S11 is not greater than 5 μm, a light emitted from the light-emitting layer 2212 leaves mainly through the upper surface S11 of the semiconductor light-emitting unit 2210 at a relatively small light-emitting angle that is not greater than 120° (e.g., ranging from 110° to 120°), thereby achieving a decreased light blocking effect between the LED chips 220. The gap (G) may be not greater than 150 μm. In some embodiments, the gap G may range from 50 μm to 120 μm, such that the light blocking effect is reduced without adjusting a size of the light-emitting device. The light-blocking coefficient (R) may be not smaller than 0.2, such that the size of the light-emitting device can be reduced without adversely affecting the light-emitting efficiency of the light-emitting device, or alternatively, an area of the LED chip 220 can be increased without adjusting the size of the light-emitting device, thereby enhancing the light-emitting efficiency of the light-emitting device. In some embodiments, the light-blocking coefficient (R) may range from 0.2 to 2.

For example, each of the LED chips 220 may have a length (L) of 1000 μm, a width (W) of 500 μm, and a thickness (T) of 150 μm. In some embodiments, when the overlapping length (OL) between two LED chips 220 is 500 μm and the gap (G) therebetween is 100 μm, the light-blocking coefficient (R) is calculated to be 0.25. In some embodiments, when the overlapping length (OL) is 1000 μm between two LED chips 220 and the gap (G) therebetween is 100 μm, the light-blocking coefficient (R) is calculated to be 0.5. In some embodiments, when the overlapping length (OL) between two LED chips 220 is 1000 μm and the gap (G) therebetween is 50 μm, the light-blocking coefficient (R) is calculated to be 1.

In some embodiments, the light-emitting device may further include a wavelength conversion layer (not shown). Specifically, the wavelength conversion layer may be formed by directly introducing phosphor powders in the encapsulant 230. Alternatively, the wavelength conversion layer may be formed as a sheet. The wavelength conversion layer may be disposed at a position that is not lower than the upper surface S11 of the LED chip 220. For example, the wavelength conversion layer is disposed on the light-emitting surface of the LED chip 220 (i.e., the upper surface S11 of the semiconductor light-emitting unit 2210).

Figure 26:
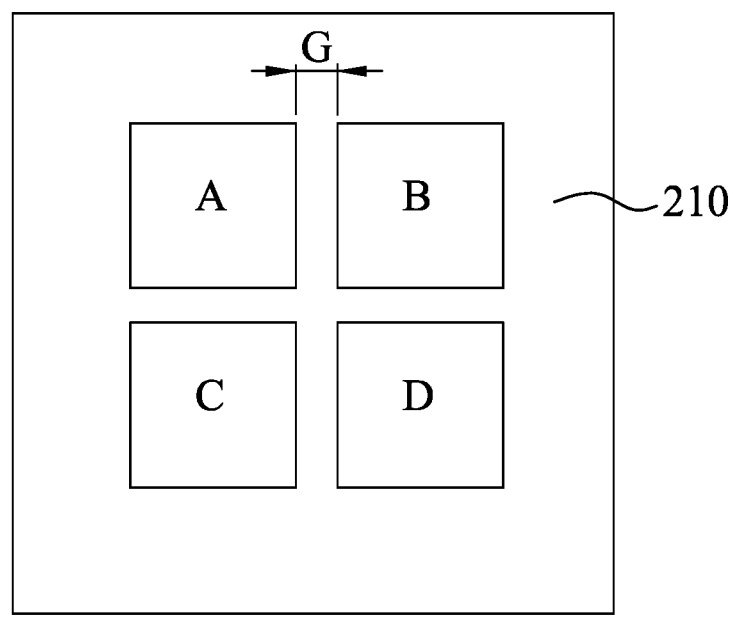
FIG. 26 is a schematic view illustrating an eleventh embodiment of the light-emitting device according to the disclosure.

Referring to FIG. 26, an eleventh embodiment of the light-emitting device according to the present disclosure is generally similar to the tenth embodiment, except that in the eleventh embodiment, the light-emitting device includes at least three LED chips that emit lights having different emission wavelengths. In some embodiments, when the light-emitting device is used at a current density of 4 A/mm$^2$ or 5 A/mm$^2$, the LED chip 220 shown in FIG. 6 may be used in the light-emitting device of FIG. 26 for serving as a stage light, and the light-emitting device includes four LED chips (A, B, C, D) that are spaced apart from each other and that emit a white light, a red light, a blue light, and a green light, respectively. For example, a light-emitting surface of the LED chip (A) is coated with a white phosphor powder for emitting a white light. The gap (G) between the LED chips (A, B, C, D) may range from 50 μm to 150 μm.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A light-emitting device, comprising:
a lead frame including a mounting region;
at least two light-emitting diode (LED) chips disposed on said mounting region of said lead frame, a light being emitted from each of said at least two LED chips at a light-emitting angle which is not greater than 120°, each of said at least two LED chips including
a substrate,
a semiconductor light-emitting unit disposed on a surface of said substrate and having a lower surface and an upper surface which serves as a light-emitting surface and which is opposite to said lower surface,
a first electrode and a second electrode which are disposed on said surface of said substrate,
an electrically connecting structure disposed between said semiconductor light-emitting unit and said substrate so as to permit said first electrode and said second electrode to be electrically connected to said lower surface of said semiconductor light-emitting unit through said electrically connecting structure, and
a first light-reflective layer disposed between said semiconductor light-emitting unit and said substrate, a first distance between said first light-reflective layer and said light-emitting surface of said semiconductor light-emitting unit being not greater than 10 μm; and
an encapsulant which encapsulates said at least two LED chips on said lead frame.
2. The light-emitting device of claim 1, wherein a light-blocking coefficient (R) is used to analyze a light emitted from one of said at least two LED chips and blocked by the other one of said at least two LED chips, and satisfies the equation (1):

$$R = F1 * F2 \qquad (1)$$

wherein
F1 is a first blocking factor which is proportional to a thickness of the other one of said at least two LED chips, and which is inversely proportional to a gap defined between said at least two LED chips, and F2 is a second blocking factor which is proportional to a ratio of an overlapping length of said at least two LED chips in a transverse direction to a perimeter of the other one of said at least two LED chips, and wherein the light-blocking coefficient (R) is not smaller than 0.2.

3. The light-emitting device of claim 2, wherein the light-blocking coefficient (R) ranges from 0.2 to 2.

4. The light-emitting device of claim 2, wherein said gap is not greater than 150 µm.

5. The light-emitting device of claim 4, wherein said gap ranges from 50 µm to 120 µm.

6. The light-emitting device of claim 1, wherein said first distance ranges from 4 µm to 8 µm.

7. The light-emitting device of claim 1, wherein said first electrode and said second electrode are located at two opposite sides of said semiconductor light-emitting unit.

8. The light-emitting device of claim 1, wherein said lead frame further includes a first wiring bonding region and a second wiring bonding region that is electrically isolated from said first wiring bonding region, said first electrode and said second electrode being respectively connected to said first wiring bonding region and said second wiring bonding region through two wires.

9. The light-emitting device of claim 1, wherein each of said at least two LED chips further includes a second light-reflective layer disposed between said first light-reflective layer and said substrate.

10. The light-emitting device of claim 9, wherein each of said at least two LED chips further includes a third light-reflective layer disposed between a bottom wall of said lead frame and said substrate.

11. The light-emitting device of claim 10, wherein a second distance between said second light-reflective layer and said upper surface of said semiconductor light-emitting unit is not greater than 20 µm.

12. The light-emitting device of claim 1, wherein said semiconductor light-emitting unit includes
a first type semiconductor layer and a second type semiconductor layer, which are proximate to and distal from said substrate, respectively, and
a light-emitting layer sandwiched between said first type semiconductor layer and said second type semiconductor layer.

13. The light-emitting device of claim 12, wherein said electrically connecting structure includes
a first electrically connecting layer disposed to permit said first electrode to be electrically connected to said first type semiconductor layer through said first electrically connecting layer, and
a second electrically connecting layer disposed to permit said second electrode to be electrically connected to said second type semiconductor layer through said second electrically connecting layer.

14. The light-emitting device of claim 13, wherein each of said at least two LED chips further includes an insulating layer, and said electrically connecting structure of each of said at least two LED chips further includes a third electrically connecting layer which has
a body portion which is separated from said first electrically connecting layer and said second electrically connecting layer through said insulating layer,
a first branch portion extending through said insulating layer to interconnect said body portion and said second type semiconductor layer, and
a second branch portion extending through said insulating layer to interconnect said body portion and said second electrically connecting layer so as to permit said second electrically connecting layer and said second electrode to be electrically connected to said second type semiconductor layer through said third electrically connecting layer.

15. The light-emitting device of claim 14, wherein said third electrically connecting layer is disposed to serve as a second light-reflective layer, and each of said at least two LED chips further includes a bonding layer disposed between said third electrically connecting layer and said substrate.

16. The light-emitting device of claim 14, wherein said third electrically connecting layer and said substrate are made of a thermally conductive material, and said third electrically connecting layer, said substrate and said second type semiconductor layer cooperate to form a thermally conductive structure configured to direct a heat accumulated in said second type semiconductor layer to the substrate.

17. The light-emitting device of claim 12, wherein a third distance between said first light-reflective layer and said light-emitting layer is not larger than 1 µm.

18. The light-emitting device of claim 1, wherein said substrate is made of a light-transmissive material.

19. The light-emitting device of claim 1, wherein said substrate is a light-reflective substrate that has a reflectivity that is not smaller than 90%.

20. The light-emitting device of claim 1, further comprising a wavelength conversion layer disposed at a position that is not lower than said upper surface of said semiconductor light-emitting unit.

* * * * *